(12) United States Patent
Zheng

(10) Patent No.: US 7,419,383 B2
(45) Date of Patent: Sep. 2, 2008

(54) SELF-BALANCED DUAL L-SHAPED SOCKET

(75) Inventor: Tieyu Zheng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/242,427

(22) Filed: Sep. 29, 2005

(65) Prior Publication Data

US 2007/0082513 A1    Apr. 12, 2007

(51) Int. Cl.
*H01R 12/00*   (2006.01)

(52) U.S. Cl. ......................................................... 439/71

(58) Field of Classification Search ............... 439/71, 439/70, 72, 66
See application file for complete search history.

(56) References Cited

U.S. PATENT DOCUMENTS

| | | | | |
|---|---|---|---|---|
| 4,445,736 | A | * | 5/1984 | Hopkins ....................... 439/71 |
| 5,221,209 | A | * | 6/1993 | D'Amico ...................... 439/71 |
| 6,431,877 | B1 | * | 8/2002 | Lemke et al. ................. 439/70 |
| 2004/0053541 | A1 | | 3/2004 | Murr |
| 2004/0058580 | A1 | | 3/2004 | Shirai et al. |
| 2004/0077202 | A1 | * | 4/2004 | Copper et al. ............... 439/241 |
| 2004/0095693 | A1 | | 5/2004 | Shirai et al. |
| 2004/0252462 | A1 | | 12/2004 | Cromwell et al. |
| 2005/0026503 | A1 | | 2/2005 | Trout et al. |
| 2005/0054218 | A1 | | 3/2005 | Liao et al. |
| 2005/0079744 | A1 | | 4/2005 | Novotny et al. |
| 2005/0112926 | A1 | | 5/2005 | Ma |
| 2005/0124183 | A1 | | 6/2005 | Hou |
| 2005/0130478 | A1 | | 6/2005 | Ma |

OTHER PUBLICATIONS

Brown, D.D., et al., "An Adaptable, High Performance LGA Connector Technology", HCD, Inc., Sunnyvale, CA 94089.
Corbin, J.S., et al., "Land Grid Array Sockets for Server Applications", IBM J. Res. & Dev., vol. 46, No. 6, pp. 763-778 Nov. 2002.

* cited by examiner

*Primary Examiner*—Phuong K Dinh
(74) *Attorney, Agent, or Firm*—Blakely, Sokoloff, Taylor & Zafman LLP

(57) ABSTRACT

An embodiment of the present invention is a Land Grid Array (LGA) socket. A first L-shaped area has a first center, a first outer long side, and a first outer short side. The first L-shaped area contains a first set of contacts oriented in a first direction. A second L-shaped area has a second center, a second outer long side, and a second outer short side and is located symmetrically to the first L-shaped area. The second L-shaped area contains a second set of contacts oriented in a second direction opposite to the first direction such that pressing a device on the first and second sets of contacts results in approximately zero force and moment.

15 Claims, 9 Drawing Sheets

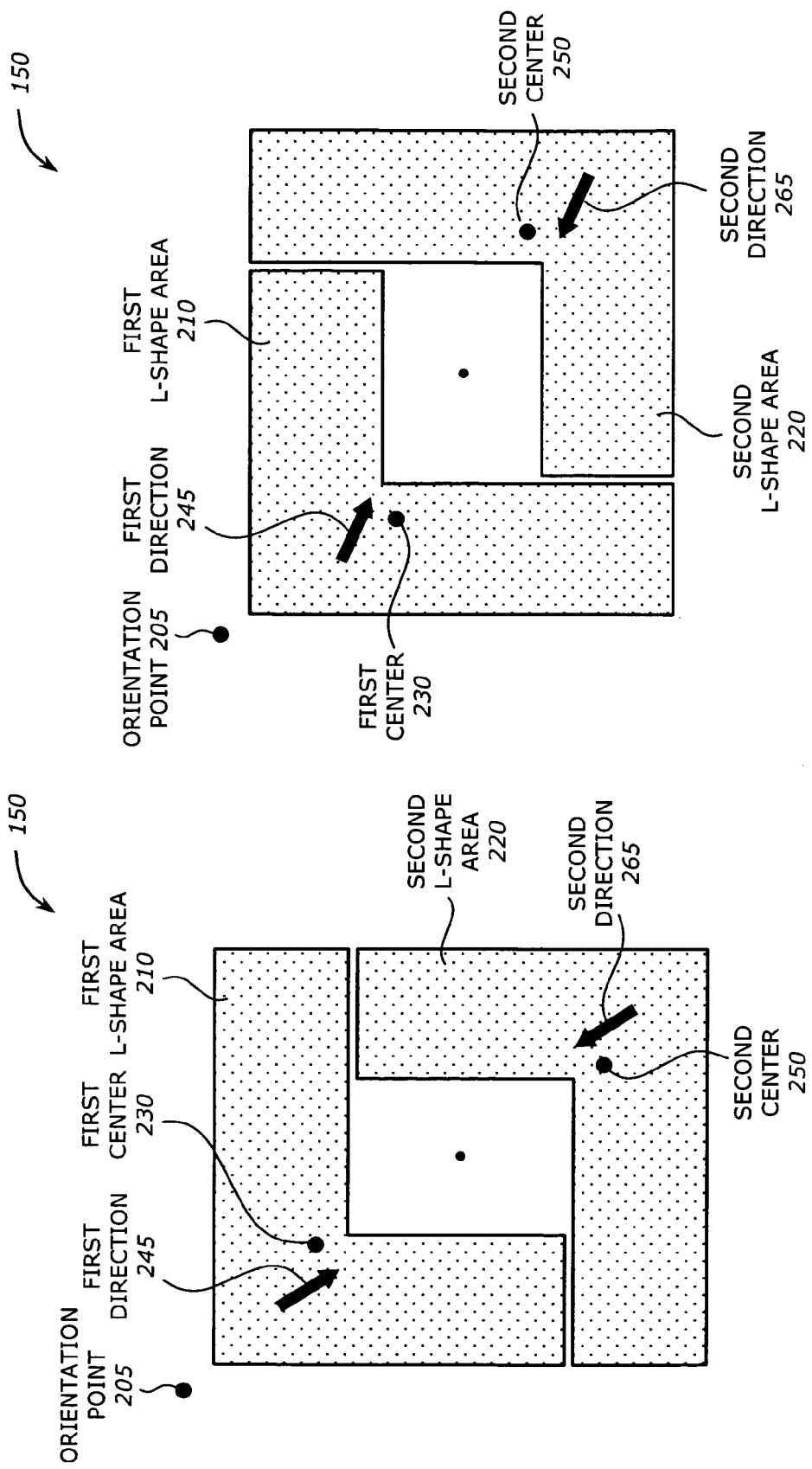

SELF-BALANCED DUAL L-SHAPED SOCKET

BACKGROUND

1. Field of the Invention

Embodiments of the invention relate to the field of semiconductor packaging, and more specifically, to sockets.

2. Description of Related Art

Compared to other packaging techniques, Land Grid Array (LGA) packaging technology offers many advantages such as ease of device manufacturing, high I/O density, low inductance, ease of upgrade, less costly, and elimination of pin damage problems as in Pin Grid Array (PGA) packaging. An LGA socket is typically used to attach a LGA device to a printed circuit board (PCB). When a LGA device is installed on a LGA socket, the rotation and pressure of the device on the socket during socket actuation may create a significant friction force that may cause deformation to the socket sidewalls or even breaking them. Existing techniques to reduce the resultant friction force and moment during socket actuation have a number of drawbacks. Most LGA sockets or connectors have the LGA contact wiping in one direction. While this configuration may be acceptable when the number of contacts is a few hundred, the resultant friction force and moment become significant when the number of contacts exceeds 1,000. Another technique lays out the LGA contacts into two diagonal triangular areas on a square socket with a square central cavity. However, when the socket or the central cavity is not square, some amount of moment results in reaction forces on the socket sidewall. In addition, the number of contacts in each row may be different in one area, causing complexities in manufacturing.

BRIEF DESCRIPTION OF THE DRAWINGS

Embodiments of invention may best be understood by referring to the following description and accompanying drawings that are used to illustrate embodiments of the invention. In the drawings:

FIG. 2B is a diagram illustrating a contact area having a second layout according to one embodiment of the invention.

FIG. 2C is a diagram illustrating a contact area having a third layout according to one embodiment of the invention.

DESCRIPTION

An embodiment of the present invention is a LGA socket. A first L-shaped area has a first center, a first outer long side, and a first outer short side. The first L-shaped area contains a first set of contacts oriented in a first direction. A second L-shaped area has a second center, a second outer long side, and a second outer short side and is positioned symmetrically to the first L-shaped area. The second L-shaped area contains a second set of contacts oriented in a second direction opposite to the first direction such that pressing a device on the first and second sets of contacts results in approximately zero force and moment.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the invention reduces or eliminates friction force and moment during socket actuation, e.g., when the device is inserted into the socket. This is achieved by orienting the contacts in opposite directions in two symmetrically positioned contact areas. The directions may be determined to be parallel to a line connecting the two centers of the contact areas.

Figure 1:
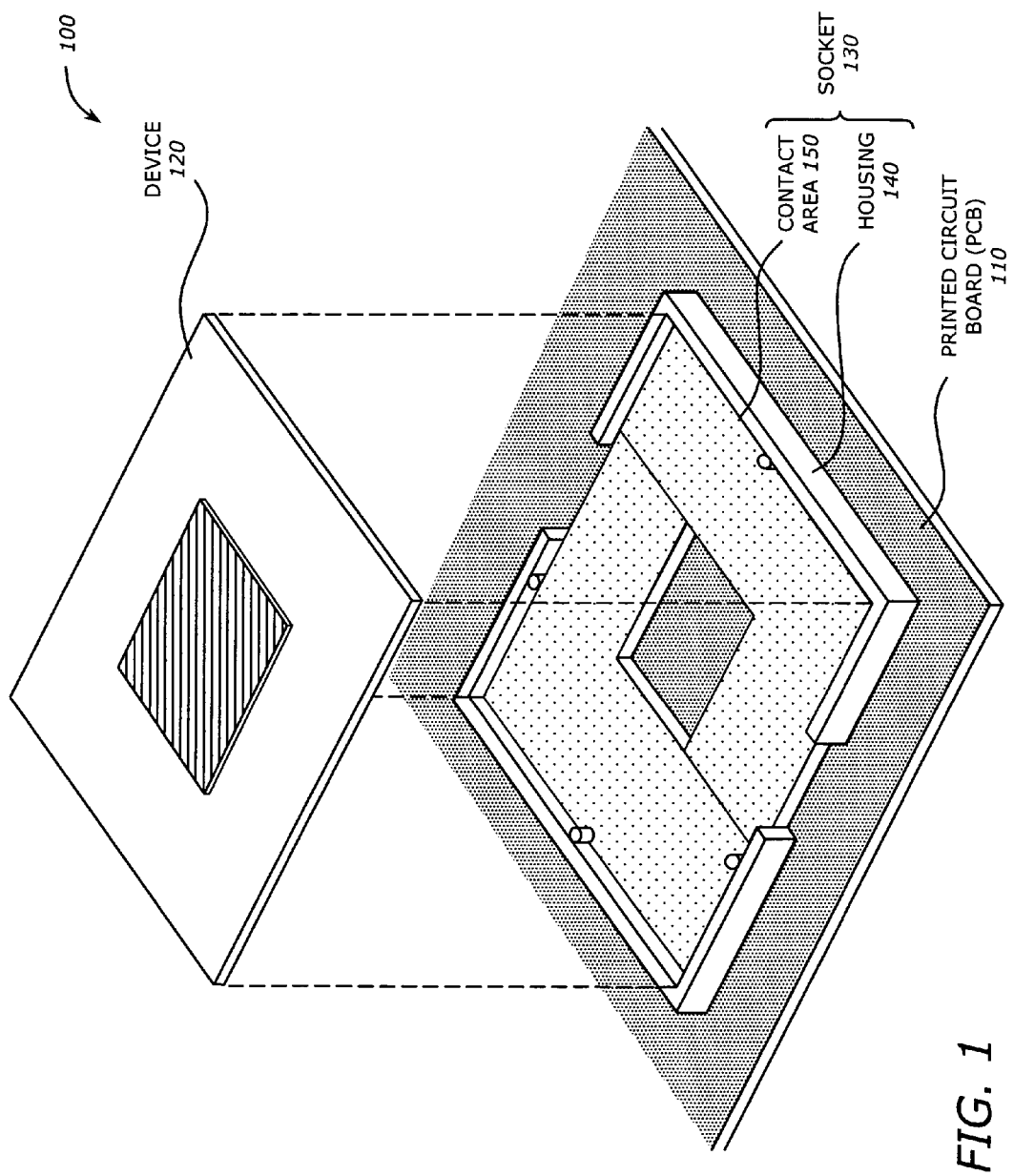
FIG. 1 is a diagram illustrating a system in which one embodiment of the invention can be practiced.

FIG. 1 is a diagram illustrating a system 100 in which one embodiment of the invention can be practiced. The system 100 includes a printed circuit board (PCB) 110, a device 120, and a socket 130.

The PCB 110 is any PCB that may contain circuits and devices used in a processing system. The PCB 110 may be a multi-layer board made of materials such as epoxy and FR4. It may include copper clad, microwave, and rigid and/or flexible laminates, etc. It typically meets a broad range of thermal and electrical requirements of various systems. It may be a motherboard or a main board in a computer system, an expansion board that plugs into an expansion slot, a daughter card that is attached directly to another board, or an adapter that contains special devices or processors such as video, graphics, network, etc. The PCB 110 is typically populated with many devices having various packaging type such as surface mount, ball grid array (BGA), microBGA, pin grid array (PGA), Land Grid Array (LGA), small outline integrated circuit (SOIC), quad flat pack (QFP), Thin Small Outline Package (TSOP), Chip Carrier (CC), Chip Scale Package (CSP), etc. The PCB 110 had traces, pads, vias and other elements to provide electrical connections that connect devices or components together.

The device 120 is any device that is encapsulated with a proper package compatible with the socket 130. In particular, the device 120 is packaged with a LGA package. Typically the device 120 has a very high pin count, ranging from several hundred pins to over a thousand pins. It may be a microprocessor, a digital signal processor, a network processor, a graphics co-processor, a floating-point co-processor, a microcontroller, an integrated controller hub, or any complex devices.

The socket 130 is used to hold the device 120 firmly and provide electrical contacts between the device 120 and the PCB 110. It is mounted on the PCB 110 through re-flow soldering process or any other mounting techniques. The socket 130 provides mechanical, thermal, and electrical support to allow the device 120 to be attached to the PCB 110. It may include a housing 140 and a contact area 150. The housing is a frame to provide mechanical encapsulation for the device. The contact area 150 contains contacts to provide electrical connections between the PCB 110 and the pads on the device 120 when the device 120 is inserted into the socket 130. The contact area 150 is designed to provide a self-balanced layout that significantly reduces or eliminates the friction force and moment when the device 120 is inserted into the socket 130 at the contact area 150. When fully inserted, the device 120 typically occupies the entire inner surface of the socket 130 within the housing 140. The socket is designed to be compatible with LGA device. However, an embodiment of the invention may be used for other types of sockets as long as there are a number of contacts that provides electrical connection between the PCB and the device when the device is inserted into the socket.

Figure 2A:
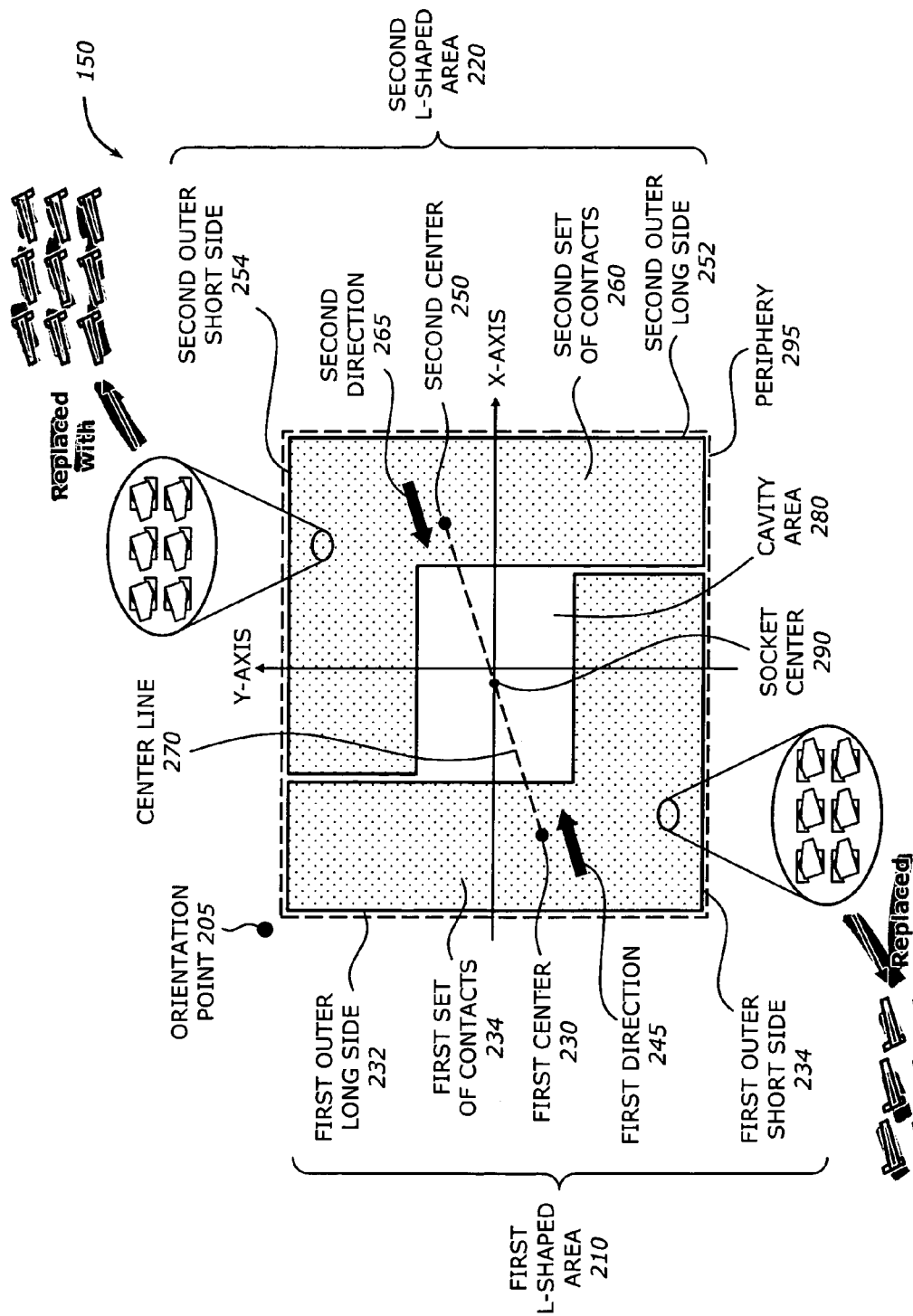
FIG. 2A is a diagram illustrating a contact area having a first layout according to one embodiment of the invention.

FIG. 2A is a diagram illustrating the contact area 150 having a first layout according to one embodiment of the invention. The contact area 150 is divided into first and second contact areas 210 and 220. It may also have an orientation point 205.

Each of the first and second contact areas 210 and 220 has a shape of the letter L consisting of two segments that are perpendicular to each other. The two segments include a long segment and a short segment. Note that although the terms "long" and "short" are used, they do not necessarily indicate the relative lengths. For example, it is possible that the two segments are of equal lengths.

The first L-shaped area 210 has a first center 230, a first outer long side 232, and a first outer short side 234. The first center 230 is located at the center of the area 210. This center may be determined as a centroid of the polygon that corresponds to the L-shaped area 210. The determination of the centroid may be performed using the area and the moment of the area about x and y axes. The first outer long side 232 is the outer side of the long segment. The first outer short side 234 is the outer side of the short segment. The first outer long and short sides 232 and 234 are substantially perpendicular to each other. In other words, the angle formed by these two sides is 90° or very close to 90° (e.g., from 85° to 95°). It contains a first set of contacts 240 that are oriented in a first direction 245.

Similarly, the second L-shaped area 220 has a second center 250, a second outer long side 252, and a second outer short side 254. Their definitions are similar to first center 230, a first outer long side 232, and a first outer short side 234, respectively, as above. It contains a second set of contacts 260 that are oriented in a second direction 265. The first and second directions 245 and 265 are opposite to each other such that inserting the device 120 into the socket 130 to press on the first and second sets of contacts 245 and 265 results in approximately zero force and moment.

By confining the sets of contacts in two L-shaped contact areas 210 and 220, there are a number of rows or columns of contacts that have the same large number of contacts. These same numbers of contacts facilitates or simplifies the contact stitching. This reduces the manufacturing costs and the cost of the socket 130, especially for high volume manufacturing.

The second L-shaped area 220 is positioned or located symmetrically, or anti-symmetrically depending on the reference point or line, to the first L-shaped area 210 with respect to a package center 290. In other words, the short segment of the one L-shaped area is attached to one end of the long segment of the other L-shaped area. The two L-shaped areas 210 and 220 are positioned such that the first outer long and short sides 232 and 234 are substantially parallel to the second outer long and short sides 252 and 254, respectively. In this manner, they are positioned to define a cavity area 280 and a periphery 295. The cavity area 280 is located around the package center 290. The cavity area 280 and the periphery 295 may be square or rectangular.

The orientation point 205 provides a reference point for orientation or the socket 130. It may or may not physically exist. It is shown to serve as the reference point to show the different arrangements of the two L-shaped areas. In FIG. 2A, the contact area 150 is shown having a first layout. In this first layout, the first L-shaped area is positioned such that its upper left corner is closest to the reference point. The first L-shaped area 210 is shown as a proper L while the second L-shaped area 220 is a letter L turned upside down.

FIG. 2B is a diagram illustrating the contact area 150 having a second layout according to one embodiment of the invention. The second layout is in essence the first layout rotated clockwise by 90° around the package center 290.

FIG. 2C is a diagram illustrating the contact area 150 having a third layout according to one embodiment of the invention. The third layout is in essence the first layout flipped horizontally. Or, the first L-shaped area 210 is a letter L turned upside down while the second L-shaped area 220 is a letter L flipped vertically.

Figure 2D:
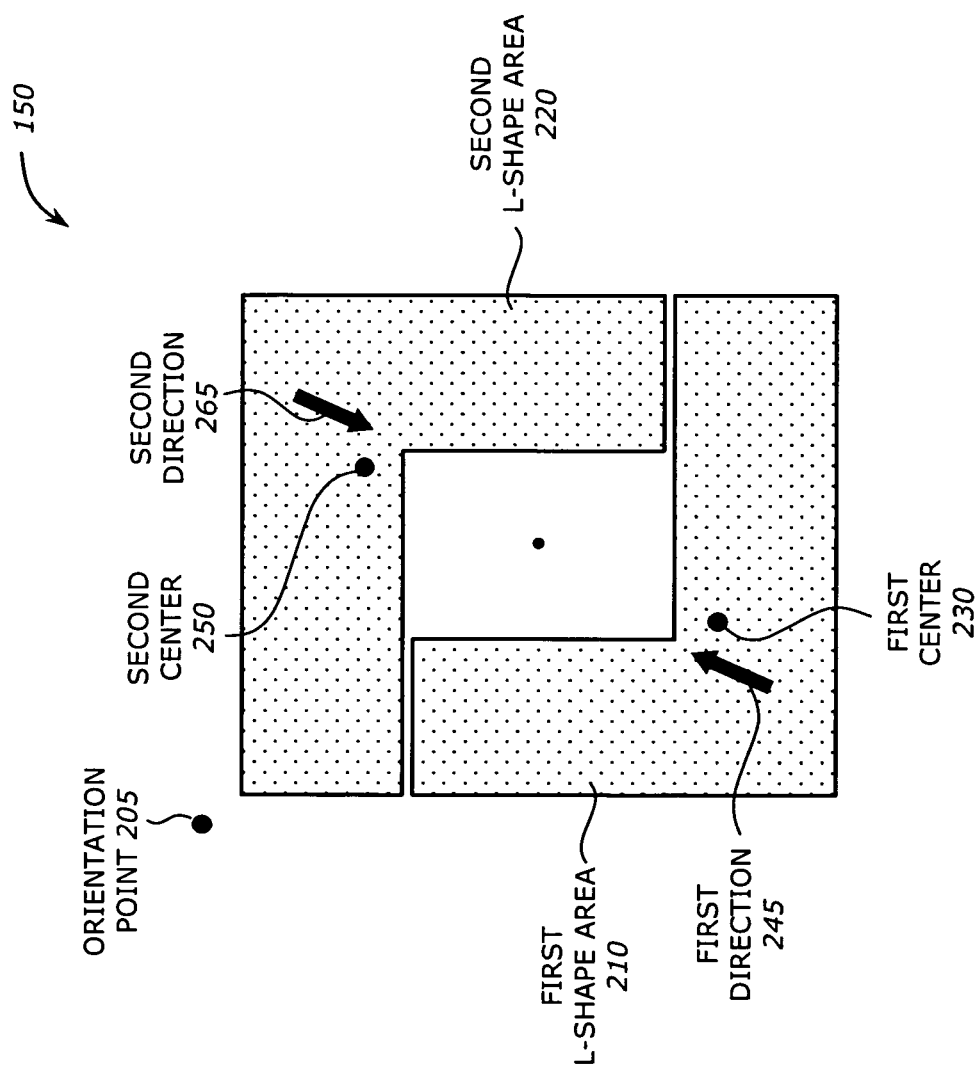
FIG. 2D is a diagram illustrating a contact area having a fourth layout according to one embodiment of the invention.

FIG. 2D is a diagram illustrating the contact area 150 having a fourth layout according to one embodiment of the invention. The fourth layout is in essence the third layout rotated counter-clockwise by 90° around the package center 290.

All definitions of the parameters in FIGS. 2B, 2C, and 2D such as centers, direction, etc. are the same as in FIG. 2A. The main difference among these four layouts is the manner in which the two L-shaped areas 210 and 220 are positioned with respect to each other. The two L-shaped areas 210 and 220 essentially have approximately equal areas and equal lengths of the sides. Therefore, there are only a limited number of ways that they may be positioned to form a square or rectangular cavity area and periphery.

Figure 3:
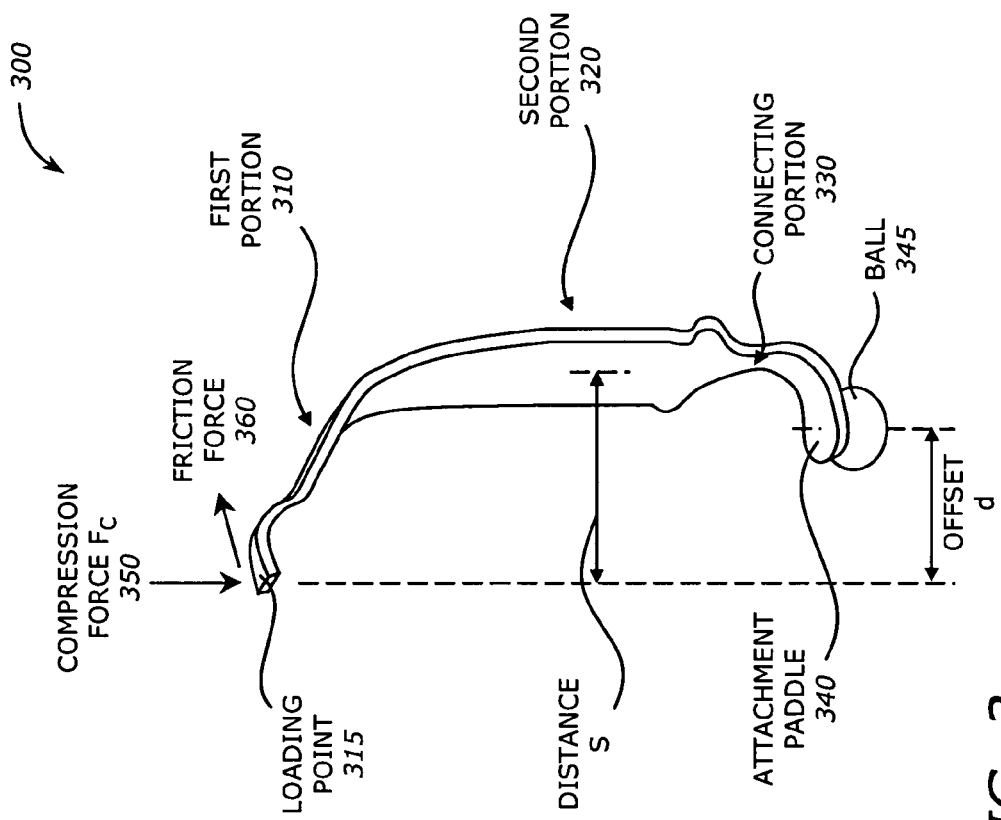
FIG. 3 is a diagram illustrating a contact according to one embodiment of the invention.

FIG. 3 is a diagram illustrating a typical contact 300 according to one embodiment of the invention. The contact 300 is one of the first and second sets of contacts contained in the first and second L-shaped contact areas 210 and 220. It typically includes a first portion 310, a second portion 320, and a connecting portion 330. The detailed structure and connecting ways of the portions 310, 320 and 330 are not limited as shown in FIG. 3.

The first portion 310 is bent at an angle with respect to the second portion 320. It has a loading or contact point 315 at the tip. The loading point 315 is the contact portion to press against a pad at the bottom of the device 120 when it is inserted into the socket 130 so that electrical contact can be made. When the device 120 is inserted into the socket 130, the first portion 310 functions as a cantilever beam to be bent down and a compression force $F_c$ 350 is directed vertically toward the loading point 315. The point 315 moves downward while moving on the pad on device 120 in the direction opposite to the friction force so this compression force 350 creates a friction force 360 pointing horizontally on the contact. Meanwhile, the package sees the counter friction force in the opposite direction.

The second portion 320 is the upright portion of the contact 300 when it is placed in the contact area 150. The connecting portion 330 is bent slightly from the second portion and has an attachment paddle 340 at the end. The attachment paddle 340 provides connection to a solder ball 345. The distance between a projection point of the loading point 315 on the surface of the contact area 150 and the solder ball 345 is an offset d. Because of this offset d, the two L-shaped areas 210 and 220 of solder ball patterns are pushed away toward two diagonal corners while the pad patterns on the package usually follow regular grid. As a result, only two diagonal corner walls are close to the contacts. Therefore, it is possible not to de-populate the corner contacts at the other two corners, maximizing the usable contact number in each of the L-shaped contact areas 210 and 220. In addition, when the contacts are placed to wipe towards the inside of the socket 130, the back of the third portion 310 is exposed to the outside of the socket 130. This helps protecting the loading point 315 from being damaged during assembly.

The orientation of the first portion 310 is the orientation of the contact 300. Each contact in the first L-shaped area 210 has a corresponding contact in the second L-shaped contact area 220. Typically, the number of contacts in the first set of contacts is equal or approximately equal to the number of contacts in the second set of contacts. When the first set of contacts is oriented in the first direction and the second set of contacts is oriented in the second direction opposite to the first direction, all the friction forces at the loading points in the first set are also pointing in the opposite direction of all the friction forces at the loading points of the second set. Therefore, when the device 120 is inserted into the socket 130, all the resulting friction forces on the package in the first set of contacts are canceled by all the friction forces in the second set of contacts. The result is that the net total friction force for the entire contacts including the first and second sets is almost zero. When the line connecting the area centers of the pad patterns on the package that correspond to the first center 230 and second center 250 passes through the package center 290, the resultant friction moments of all the contacts on the package are also approximately cancelled.

In summary, when all the contacts in the first L-shaped contact area 210 and all the contacts in the second L-shaped contact area 220 are oriented in opposite directions, the net total friction forces and moments are equal or approximately equal to zero. The package therefore is not rotated during socket actuation. This significantly reduces or eliminates the deformation or collapse of the socket side walls during socket actuation.

Figure 4:
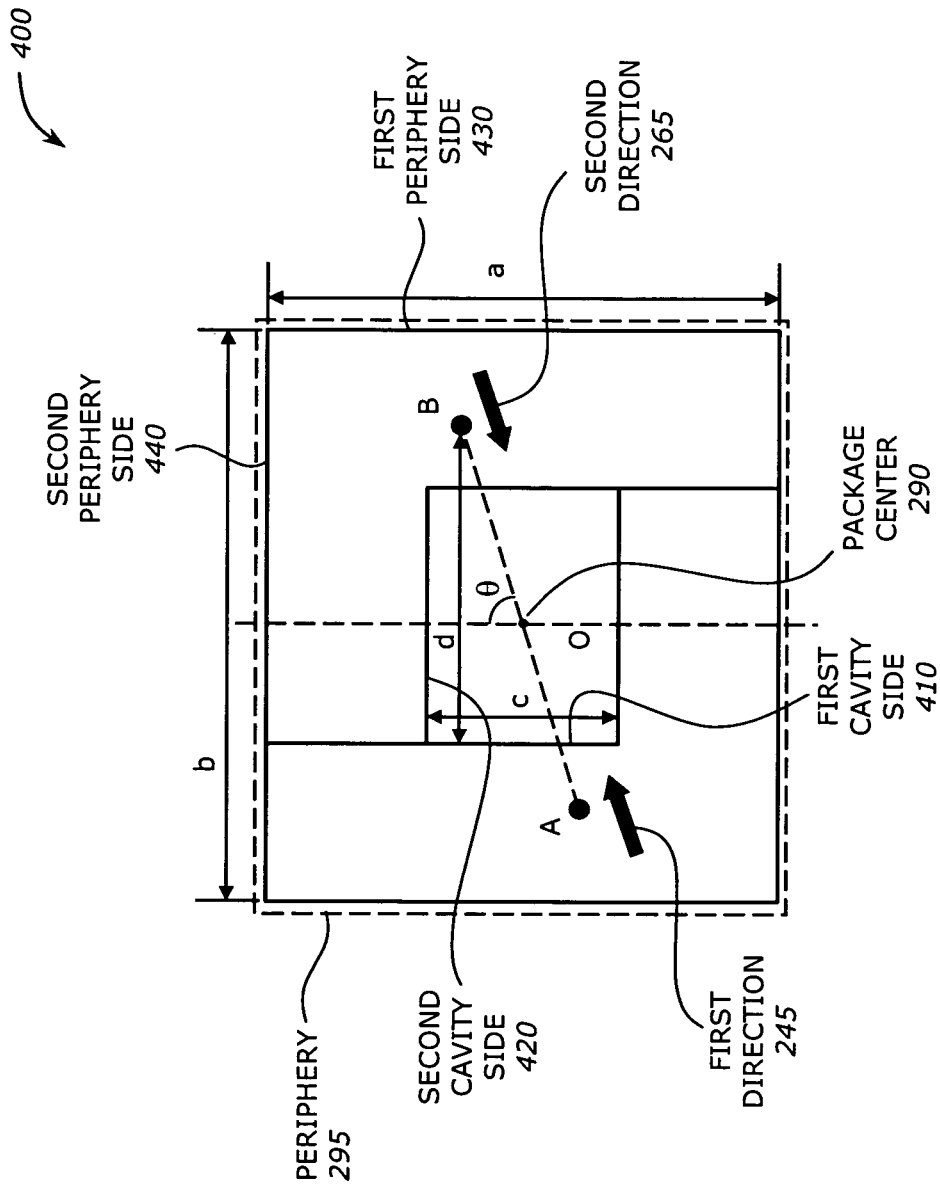
FIG. 4 is a diagram illustrating a wiping angle according to one embodiment of the invention.

FIG. 4 is a diagram illustrating a wiping angle according to one embodiment of the invention. The wiping angle is the angle formed by the center line connecting the two centers of the first and second L-shaped contact areas and the vertical line.

The first and second directions 245 and 265 of the orientation of the contacts in the first and second L-shaped areas 210 and 220 are parallel or substantially parallel to a line AB connecting the first and second centers. This line passes or approximately passes through the package center 290. This line may also be the line connecting the centers of the L-shaped pad patterns on the package that correspond to the L-shaped contact areas 210 and 220.

The two L-shaped contact areas 210 and 220 are positioned or arranged such that they form or define the cavity area 280 and the periphery 295. The cavity area 280 is located around the package center 290. The cavity area 280 has first and second cavity sides 410 and 420 of lengths c and d, respectively. The periphery 295 has first and second periphery sides 430 and 440 of lengths a and b, respectively.

The wiping angle θ is determined by $\theta = \arctan[a(b^2-d^2)]/[d(a^2-c^2)]$ using geometry.

Figure 5:
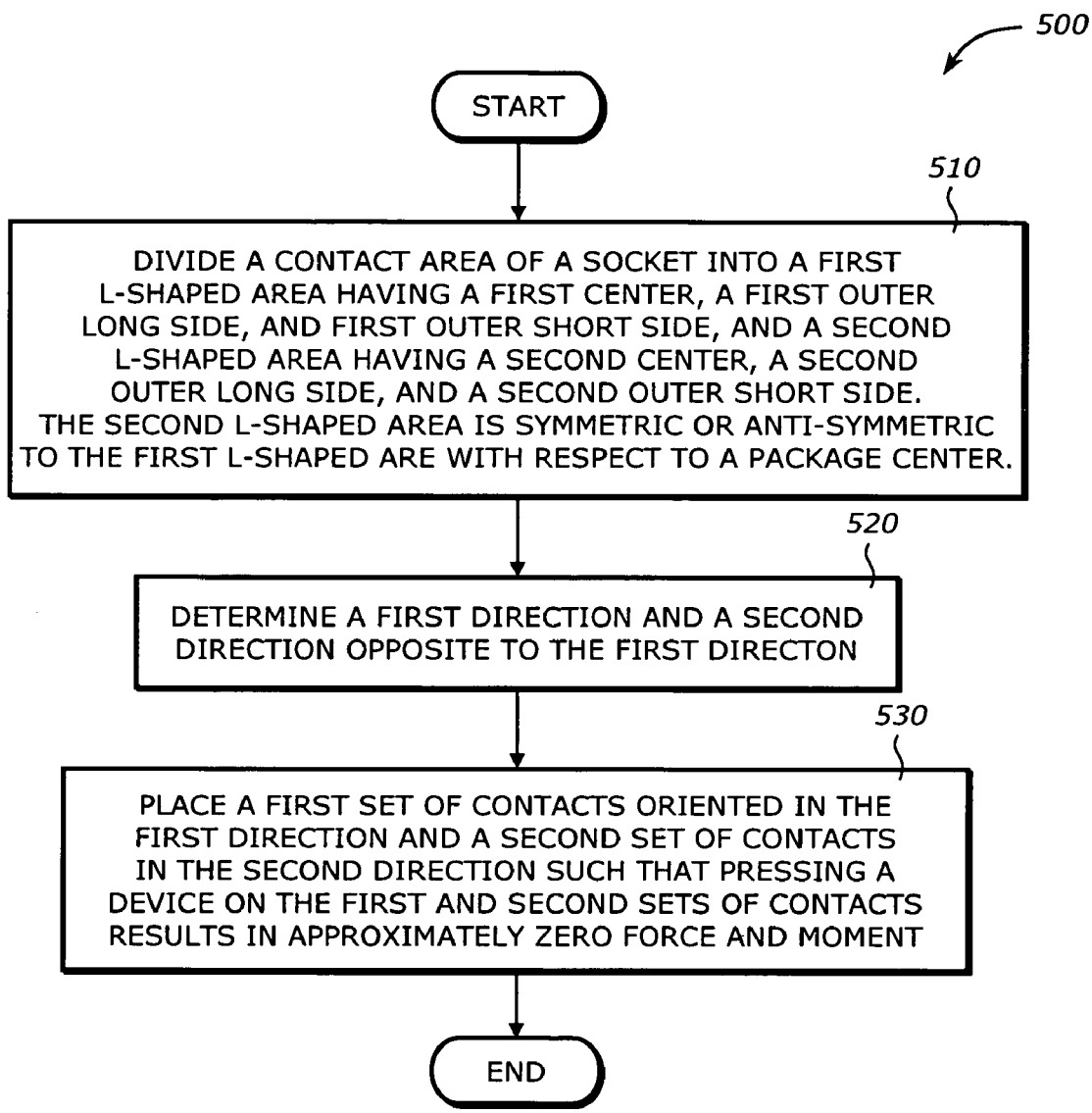
FIG. 5 is a flowchart illustrating a process to configure the contact area according to one embodiment of the invention.

FIG. 5 is a flowchart illustrating a process 500 to configure the contact area according to one embodiment of the invention.

Upon START, the process 500 divides a contact area of a socket into first and second L-shaped contact areas (Block 510). The first L-shaped contact area has a first center, a first outer long side, and a first outer short side. The second L-shaped contact area has a second center, a second outer long side, and a second outer short side. The second L-shaped contact area is symmetric or anti-symmetric to the first L-shaped area with respect to a socket center. Because of a possible offset between the contact point 350 and the solder ball 345, the location of the contact area of the socket makes the contact point 350 landing on the pads which usually have a regular grid. On the other hand, the pattern of the contact points 350 has the same L-shape pattern as that of the solder balls 345. The pattern of contact points 350 may be offset from the pattern of solder balls 345 due to the offset between them as shown in FIG. 3.

Next, the process 500 determines a first direction and a second direction opposite to the first direction (Block 520). Then, the process 500 places a first set of contacts oriented in the first direction in the first L-shaped area and a second set of contacts in the second direction in the second L-shaped area such that pressing a device on the first and second sets of contacts results in approximately zero force and moment (Block 530).

Figure 6:
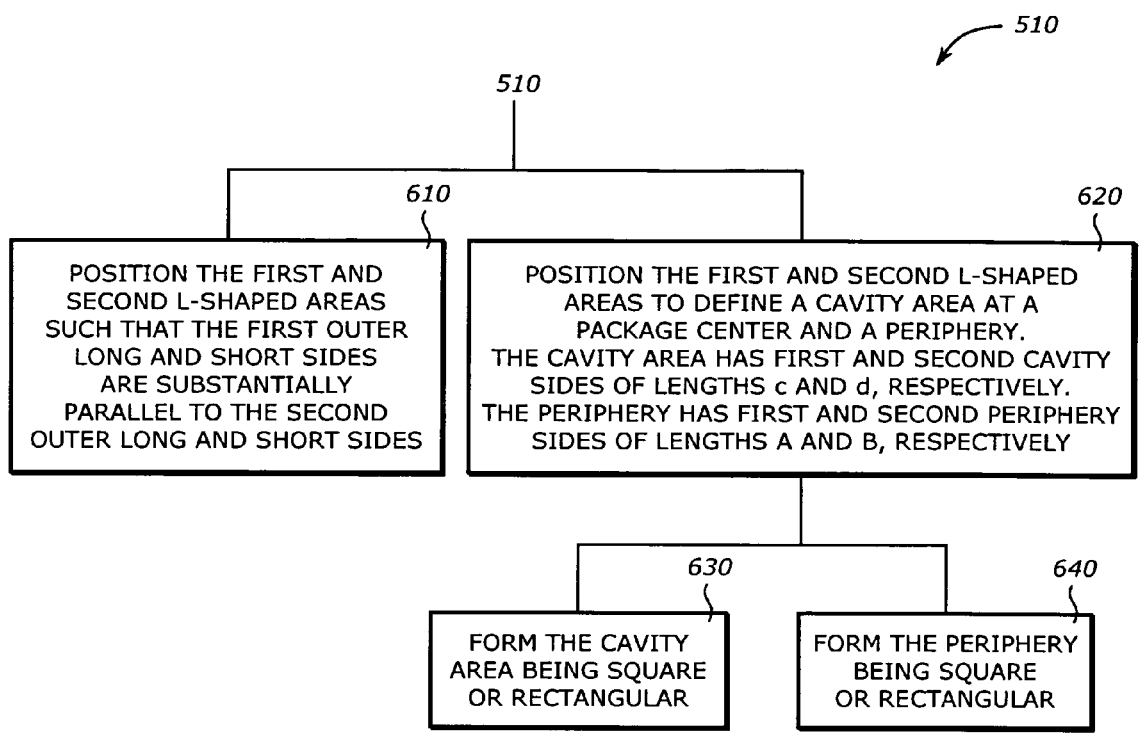
FIG. 6 is a diagram illustrating a process to divide a contact area according to one embodiment of the invention.

FIG. 6 is a diagram illustrating a process 510 to divide a contact area according to one embodiment of the invention. The process 510 includes two modules or functions 610 and 620. Note that the process 510 may perform the modules or functions 610 and 620 separately or both in any order.

In the module or function 610, the process 510 positions the first and second L-shaped areas such that the first outer long and short sides are substantially parallel to the second outer long and short sides. In the module or function 620, the process 510 positions the first and second L-shaped areas to define a cavity area at a socket center and a periphery. The cavity area has first and second cavity sides of lengths c and d, respectively. The periphery has first and second periphery sides of lengths a and b, respectively, The module or function 620 calls or invokes the modules or functions 630 and 640. In the module or function 630, the process 510 forms the cavity area being square or rectangular. In the module or function 640, the process 510 forms the periphery being square or rectangular.

Figure 7:
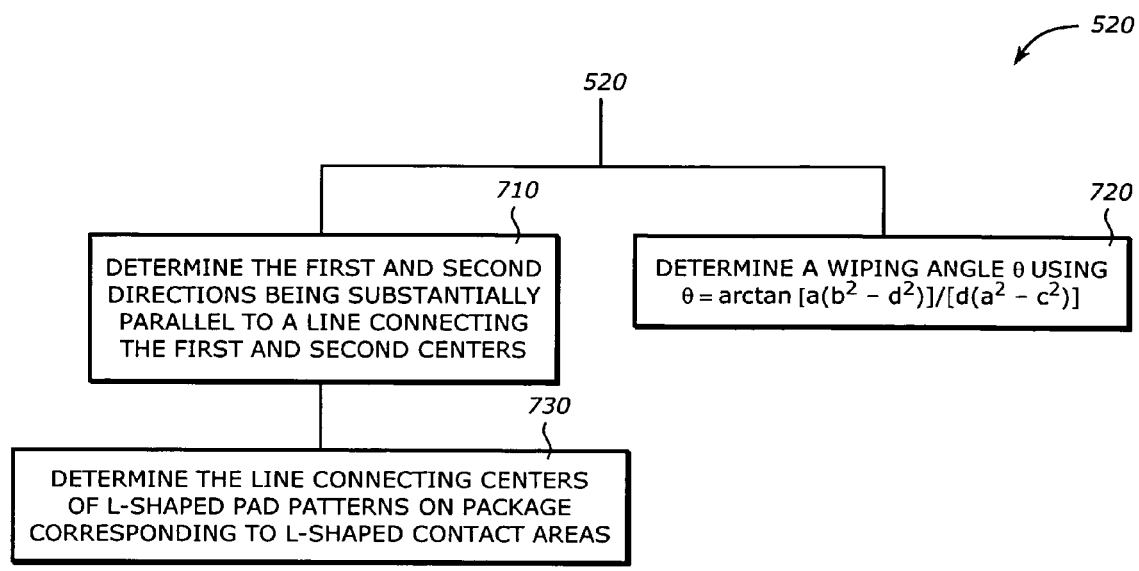
FIG. 7 is a flowchart illustrating a process to determine the first and second directions according to one embodiment of the invention.

FIG. 7 is a diagram illustrating a process 520 to determine the first and second directions according to one embodiment of the invention. The process 520 calls the modules or functions 710 and/or 720. In the module 710, the process 520 determines the first and second directions being substantially parallel to a line connecting the first and second centers. The module or function 710 calls or invokes the module or function 730. In the module 730, the process 520 determines the line connecting the first and second centers to approximately pass through the socket center. In the module 720, the process 520 determines a wiping angle θ using $\theta = \arctan[a(b^2-d^2)]/[d(a^2-c^2)]$.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A socket comprising:
   a first L-shaped area having a first center, a first outer long side, and a first outer short side, the first L-shaped area containing a first set of contacts forming rows and columns and oriented in a first direction; and a second L-shaped area having a second center, a second outer long side, and a second outer short side and located symmetrically to the first L-shaped area, the second L-shaped area containing a second set of contacts forming rows and columns and oriented in a second direction opposite to the first direction such that pressing a device on the first and second sets of contacts results in approximately zero force and moment.

2. The socket of claim 1 wherein the first and second L-shaped areas are positioned such that the first outer long and short sides are substantially parallel to the second outer long and short sides.

3. The socket of claim 1 wherein the first and second L-shaped areas are positioned to define a cavity area at a package center and a periphery, the cavity area having first and second cavity sides of lengths c and d, respectively, the periphery having first and second periphery sides of lengths a and b, respectively.

4. The socket of claim 1 wherein the first and second directions are substantially parallel to a line connecting the first and second centers.

5. The socket of claim 4 wherein the first set of contacts has a wiping angle $\theta$ determined by $\theta=\arctan [a(b^2-d^2)]/[d(a^2-c^2)]$.

6. The socket of claim 4 wherein a center line connecting centers of L-shape pad patterns on a package corresponding to the L-shaped areas approximately passes through the package center.

7. The socket of claim 3 wherein one of the cavity area and the periphery is square or rectangle.

8. A system comprising:

a printed circuit board (PCB);

a device; and a socket mounted on the PCB to house the device, the socket having a housing and a contact area, the contact area comprising:

a first L-shaped area having a first center, a first outer long side, and a first outer short side, the first L-shaped area containing a first set of contacts forming rows and columns and oriented in a first direction, and a second L-shaped area having a second center, a second outer long side, and a second outer short side and located symmetrically to the first L-shaped area, the second L-shaped area containing a second set of contacts forming rows and columns and oriented in a second direction opposite to the first direction such that pressing the device on the first and second sets of contacts results in approximately zero force and moment.

9. The system of claim 8 wherein the first and second L-shaped areas are positioned such that the first outer long and short sides are substantially parallel to the second outer long and short sides.

10. The system of claim 8 wherein the first and second L-shaped areas are positioned to define a cavity area at a package center and a periphery, the cavity area having first and second cavity sides of lengths c and d, respectively, the periphery having first and second periphery sides of lengths a and b, respectively.

11. The system of claim 8 wherein the first and second directions are substantially parallel to a line connecting the first and second centers.

12. The system of claim 8 wherein the first set of contacts has a wiping angle $\theta$ determined by $\theta=\arctan [a(b^2-d^2)]/[d(a^2-c^2)]$.

13. The system of claim 10 wherein a center line connecting centers of L-shape pad patterns on a package corresponding to the L-shaped areas approximately passes through the package center.

14. A socket comprising:

a first L-shaped area having a first center, a first outer long side, and a first outer short side, the first L-shaped area containing a first set of contacts forming rows and columns and oriented in a first direction; and a second L-shaped area having a second center, a second outer long side, and a second outer short side and located symmetrically to the first L-shaped area, the second L-shaped area containing a second set of contacts forming rows and columns and oriented in a second direction opposite to the first direction such that pressing a device on the first and second sets of contacts results in approximately zero force and moment;

wherein each contact in the first and second sets of contacts comprises:

a first portion having a loading point at a tip, the first portion functioning as a cantilever beam to be bent down under a compression force directed vertically toward the loading point when the device is inserted;

a second portion in an upright position; and a connecting portion bent slightly from the second portion and having an attachment paddle at an end, the attachment paddle providing connection to a solder ball.

15. A system comprising:

a printed circuit board (PCB);

a device; and a socket mounted on the PCB to house the device, the socket having a housing and a contact area, the contact area comprising:

a first L-shaped area having a first center, a first outer long side, and a first outer short side, the first L-shaped area containing a first set of contacts forming rows and columns and oriented in a first direction, and a second L-shaped area having a second center, a second outer long side, and a second outer short side and located symmetrically to the first L-shaped area the second L-shaped area containing second set of contacts forming rows and columns and oriented in a second direction opposite to the first direction such that pressing the device on the first and second sets of contacts results in approximately zero force and moment;

wherein each contact in the first and second sets of contacts comprises:

a first portion having a loading point at a tip, the first portion functioning as a cantilever beam to be bent down under a compression force directed vertically toward the loading point when the device is inserted;

a second portion in an upright position; and a connecting portion bent slightly from the second portion and having an attachment paddle at an end, the attachment paddle providing connection to a solder ball.

* * * * *